United States Patent [19]

Purdy et al.

[11] 3,989,546
[45] Nov. 2, 1976

[54] THERMOELECTRIC GENERATOR WITH HINGED ASSEMBLY FOR FINS

[75] Inventors: David L. Purdy, Indiana; Zalman M. Shapiro; Thomas F. Hursen, both of Pittsburgh; Gerould W. Maurer, Apollo, all of Pa.

[73] Assignee: ARCO Medical Products Company, Leechburg, Pa.

[22] Filed: Mar. 11, 1974

[21] Appl. No.: 449,818

Related U.S. Application Data
[62] Division of Ser. No. 142,070, May 10, 1971, Pat. No. 3,822,151.

[52] U.S. Cl. .............................. 136/202; 136/205; 136/212
[51] Int. Cl.² ..................... H01L 35/02; G21H 1/10
[58] Field of Search ............ 136/205, 202, 212, 208

[56] References Cited
UNITED STATES PATENTS

| 3,006,979 | 10/1961 | Rich | 136/212 |
|---|---|---|---|
| 3,082,276 | 3/1963 | Corry et al. | 136/205 |
| 3,208,877 | 9/1965 | Merry | 136/212 |
| 3,272,658 | 9/1966 | Rush | 136/205 |
| 3,301,714 | 1/1967 | Lyman, Jr. | 136/212 |
| 3,412,566 | 11/1968 | Townsend et al. | 136/212 |
| 3,523,832 | 8/1970 | Rupprecat et al. | 136/205 |
| 3,539,399 | 11/1970 | Harvey | 136/212 |
| 3,714,539 | 1/1973 | Hampl, Jr. | 136/212 UX |

Primary Examiner—Maynard R. Wilbur
Assistant Examiner—Richard E. Berger
Attorney, Agent, or Firm—John R. Ewbank

[57] ABSTRACT

A cylindrical casing has a central shielded capsule of radioisotope fuel. A plurality of thermonuclear modules are axially arranged with their hot junctions resiliently pressed toward the shield and with their cold junctions adjacent a transition member having fins radiating heat to the environment. For each module, the assembly of transition member and fins is hinged to the casing for swinging to permit access to and removal of such module. A ceramic plate having gold layers on opposite faces prevents diffusion bonding of the hot junction to the shield.

7 Claims, 12 Drawing Figures

THERMOELECTRIC GENERATOR WITH HINGED ASSEMBLY FOR FINS

This is a divisional of application Ser. No. 142,070 filed May 10, 1971, now U.S. Pat. No. 3,822,151.

This invention relates to the generation of electricity and has particular relationship to electrical generators particularly for use in space or in remote parts of the earth where commercial power is not available or within the human body. Such generators typically include an isotopic heat source or capsule including a radioactive isotope, such as strontium 90, cobalt 60 or plutonium 238, which serves as a primary source of energy and a heat-to-electricity converter in heat-interchange relationship with the capsule. Electricity is derived from the converter. The capsule is enclosed in a biological shield. The converter typically consists of one or more thermoelectric modules each having a hot junction thermally connected to the shield through a heat-transfer assembly, and a cold junction thermally connected to a heat-rejection assembly. Supporting structure is provided for the capsule, heat shield, modules and heat-rejection assembly.

It is necessary that the capsule and biological shield be suspended from the supporting structure. Typically, this suspension is a spider of elongated members which termally shunts the connection of the shield to the cold junction. Since the energy from the primary source must be conserved, it is essential that the thermal conduction of this suspension to the support be minimized. But it is also necessary that this suspension have high strength and high impact resistance; thermally insulating materials are then not in general suitable for this suspension. It is an object of this invention to meet the above conditions and to provide a generator including a heat capsule in a biological shield in which the suspension from the supporting structure for the shield and capsule shall be of high strength and high impact resistance and whose thermal conduction of heat from the shield to the supporting structure shall be minimized.

In arriving at the aspect of this invention involving the suspension it has been realized that the shield and capsule may be conveniently suspended by spiders extending from opposite sides of the capsule, each spider including three elongated members. Where the shield is in the form generally of an elongated cylinder, the spiders may extend from the ends of the shield. It has further been realized that to minimize the heat flow to the supporting structure the elongated members of each spider should be so positioned that the pairs of these members define three different planes, the planes being mutually substantially at right angles to each other. In accordance with this invention a generator is provided having a shield suspended by sets of three elongated members each, extending from opposite sides of the shield, the pairs of members of each set defining planes which are mutually substantially at right angles to each other.

Another aspect of this invention arises from the realization that the elongated members are heated by the shield to which they are connected and that the resulting thermal expansion of the shield may cause these members to sag and reduce their suspending effectiveness. It is an object of this invention to overcome this deficiency of the suspension. In accordance with this invention the elongated members are pretensioned to an extent such that the pretensioning compensates for the expansion and prevents the sagging. The pretensioning is effected by a nut which deflects a strip or band in dependence upon the pretensioning. The extent of the pretensioning may be determined by measuring the deflection of the band.

An object of this invention is to provide a generator whose thermoelectric modules may be readily replaced. Such ready replacement presents difficulties because of the tendency of the heat transfer assembly for the hot junction to diffusion bond to the parts with which it is in heat-transfer relationship. The heat-transfer assembly includes a saddle of a highly conducting material, such as copper, which is brazed to the shield. Heat is transferred from this saddle to the hot junction through a corrosion-resistant plate which transfers heat to a second corrosion-resistant plate that serves as a cap for the module and engages an electrically insulating, but thermally conducting, sheet between the hot junction and corrosion-resistant means. The corrosion-ressitant means may be a nickel-base alloy such as Hastelloy-C (see page 173, Materials in Design Engineering - Materials Section Issue - 1965). To achieve effective transfer of heat from the shield to the hot junction of the module, it is necessary that substantial pressure be maintained between the hot junction and the shield through the heat-transfer assembly.

An aspect of this invention arises from the realization that this pressure would diffusion bond the corrosion-resistant plate to the saddle which it engages and to the other corrosion-resistant plate and is directed to the prevention of such bonding.

In accordance with this invention a plate or sheet of good thermally conducting material coated on both sides with gold or other good thermally conducting material is interposed between the corrosion-resistant plates. Typically the sheet may be composed of alumina ($Al_2O_3$). While the gold diffusion bonds to the corrosion-resistant material, it is separable from the sheet to which it does not bond. The module with its cap may then be readily removed for replacement from the generator.

Another aspect of this invention arises form the necessity of providing an adequate and effective heat sink or heat-rejection assembly for the cold junction and it is an object of this invention to provide a generator with such a heat sink. In accordance with this invention the generator includes a heat sink including a central fin transition member in heat-interchange relationship with the cold junction of each module. Fins extend from both opposite faces of this member and effectively transfer the heat form the cold junction. The fin-transition member has a cup intermediate its ends which holds the shock-absorbing and pressure applying mechanisms for the associated module at the same time providing for effective heat rejection.

Typically the shield may be generally cylindrical with a pair or pairs of thermoelectric modules extending diametrically from its side wall and with diametrical fin assemblies with the cups of each fin-transition members supporting the shock-absorbing and pressure-applying mechanism for each module.

Each fin-assembly is hinged at one end so that it may be removed. The fin-assembly is usually very heavy (typically about 120 pounds for a 50 watt generator) and a double-acting hinge is provided to facilitate removal.

For a better understanding of this invention, both as to its organization and as to its method of operation, together with additional objects and advantages thereof, reference is made to the following description taken in connection with the accompanying drawing, in which.

Figure 1:
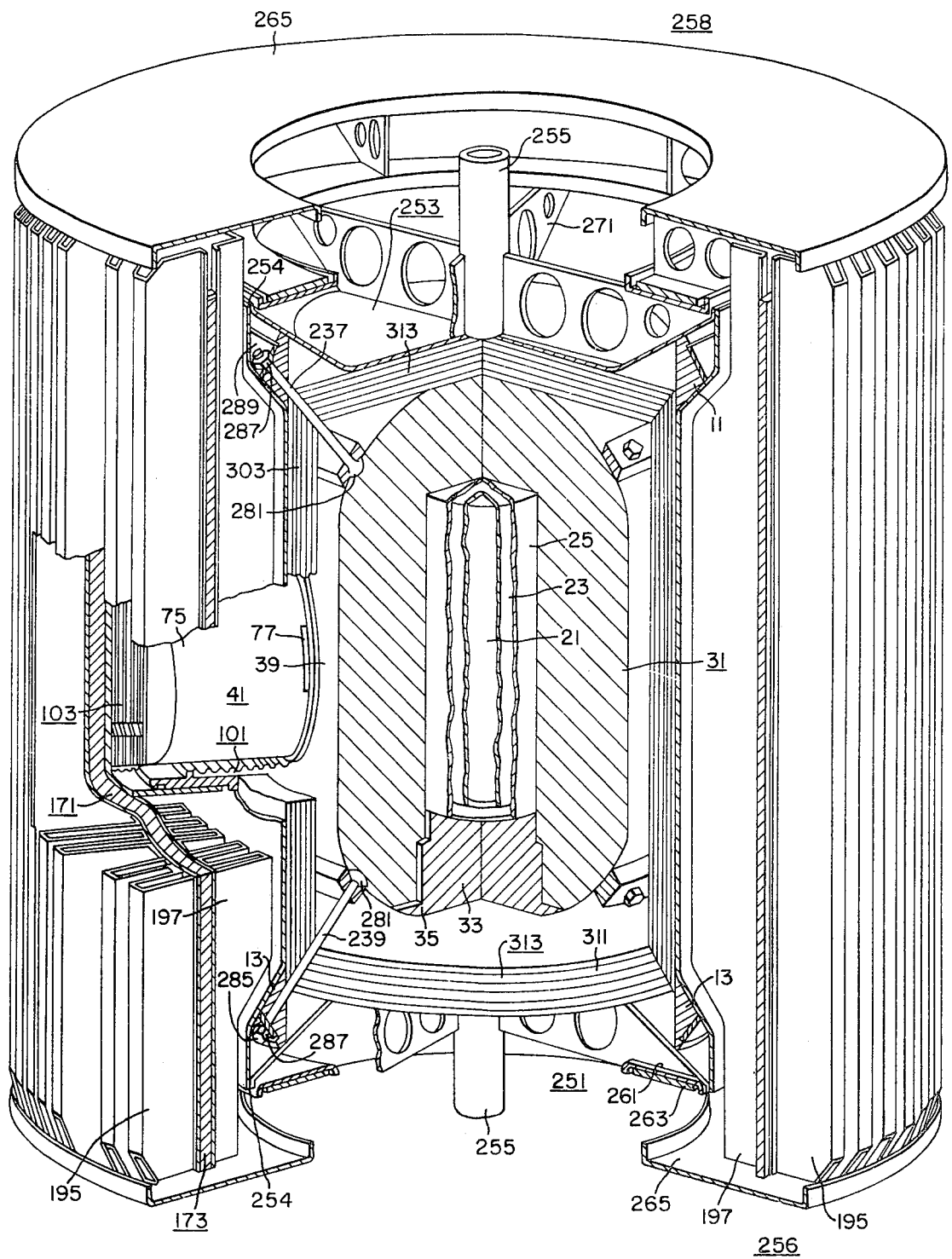
FIG. 1 is a view in perspective of a generator according to this invention with a part removed to show the inner components.

The generator shown in the drawings includes an Isotopic Heat Capsule, which serves as primary source of energy, a Biological Shield enclosing the Capsule, a Thermoelectric Module engaged in heat interchange relationship with diametrically opposite faces of the shield, a Radiation Heat Shield around the Biological Shield, a Fin Assembly in effective heat-rejection relationship with the cold junction of each Module.

The Capsule, Biological Shield, and Radiation Heat Shield are enclosed in a Casing which has re-entrant portions for the Modules and includes supporting rings 11 and 13 for the Biological Shield at opposite ends. The Biological Shield and Capsule are suspended from these rings 11 and 13 by Spiders.

The Capsule includes a fuel rod or bar 21 of a radioactive isotope, typically strontium titanate whose strontium is SR 90. The bar 21 is enclosed in a casing 23 typically of T111 alloy (Ta, W 8%, Hf 2.5%) which is compatible at high temperatures with the strontium titanate and has impact strength at high temperatures. This casing 23 is enclosed in a casing 25 of Hastelloy-C alloy which is corrosion-resistant.

Figure 2:
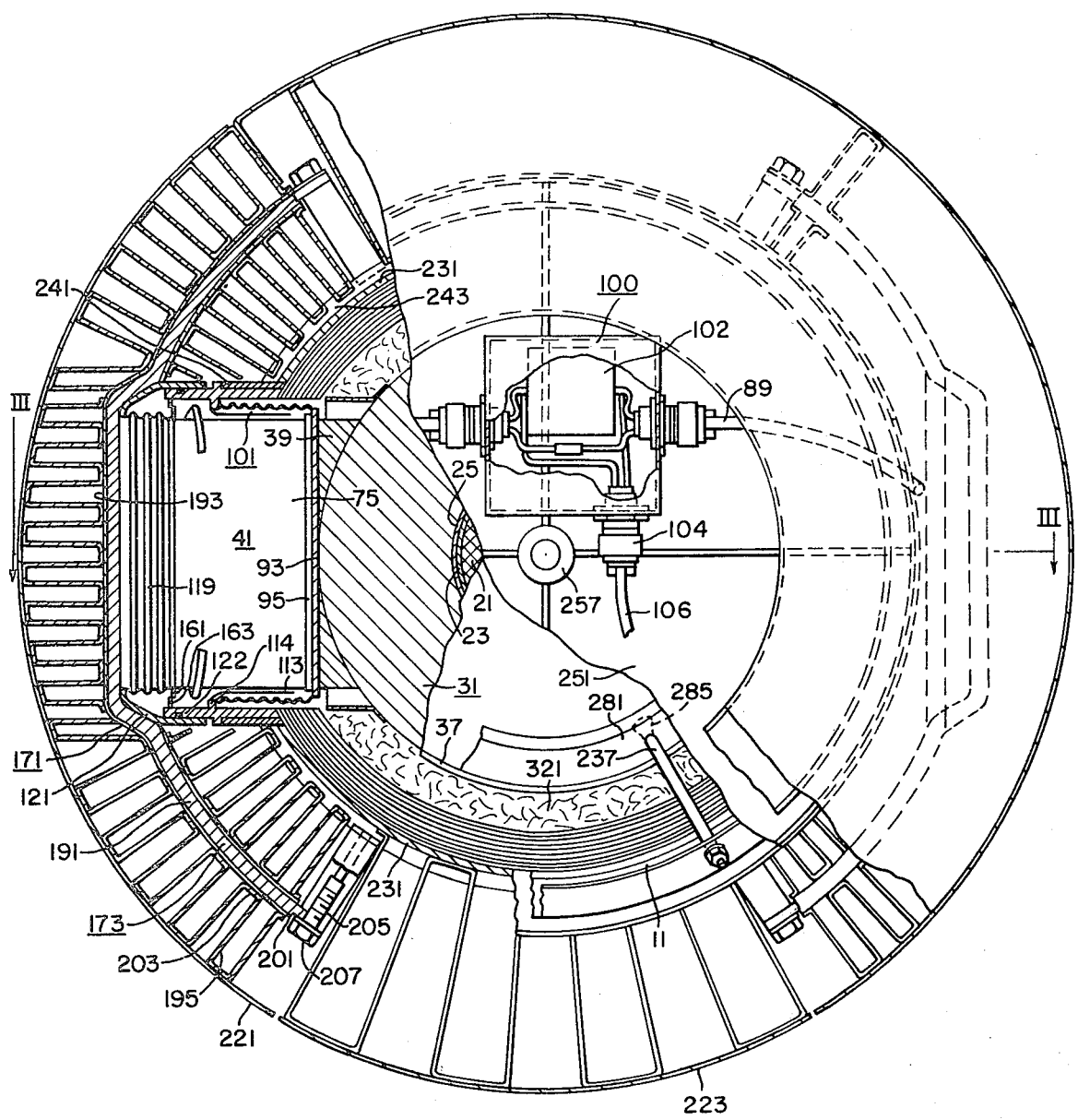
FIG. 2 is a plan view of this generator with parts broken away and sectioned.

The Biological Shield includes a generally cylindrical mass 31 of Kerrnertium W-2 alloy (97.6% W and 2.4% copper and nickel) described in leaflet L-502 of Kennametal, Inc., Latrobe, Pa. The mass 31 has a central cavity for the Capsule accessible through a stepped opening in one end through which the Capsule is inserted. The opening is sealed by a stepped plug 33 having flanges 35 bolted to the part of the mass 31 adjacent the plug. The plug 33 is a slip fit in the opening and when the plug 33 and adjacent metal are heated by the Capsule the plug 33 is welded to the boundary of the opening. Shims 37 (FIG. 2) of copper are brazed along diametrical opposite surfaces of the mass 31. Saddles 39 of copper for connection to the Thermoelectric modules are brazed at diametrical positions of the mass 31 between the shims 37.

The heat of the Capsule is converted into electricity by Modules 41 and 43 mounted at opposite diametrical positions of the Shield with the shield in good heat transfer relationship with the hot junction shoes 45 of the Module.

Figure 10:
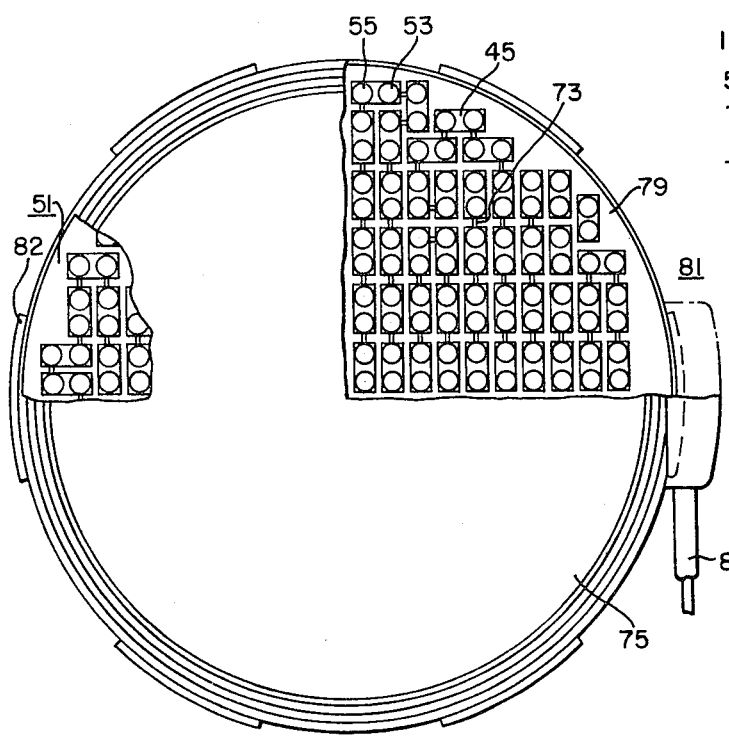
FIG. 10 is a section of this module taken along line X—X of FIG. 9.
Figure 9:
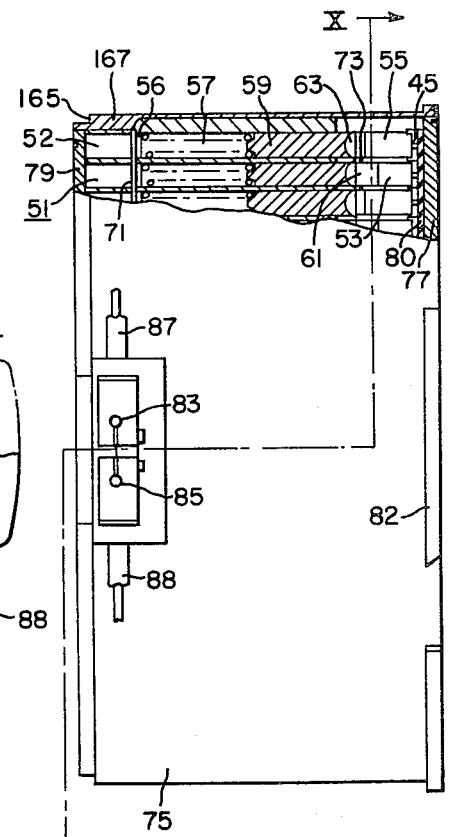
FIG. 9 is a side view of a thermoelectric module, with a part broken away, used in the practice of this invention.

Each Module 41 and 43 includes a cylindrical block 51 (FIGS. 9 and 10) of aluminum having a plurality of pairs of longitudinal holes 52 corresponding in number to the pairs of positive and negative semiconductor pellets 53 and 55 respectively which the Module is to include. The walls of each hole is oxidized so that it is electrically insulating. In each hole there is an electrically insulating support washer 56, a spring 57, a plug or follower 59 of aluminum, and end caps 61 and 63, and a positive or negative pellet 53 or 55, as the case may be. Typically, the pellets are of doped lead-telluride and the end caps 61, 63 are of copper-tellurium alloy. The washers 56 and springs 57 are held in the holes 52 by wires 71 extending across the block 51 generally along diameters of the holes. Each spring 57 seats in a shoulder in a plug 59 and urges the plug into firm electrical and thermal contact with the associated end cap 61 or 63 in turn urging the end cap into firm thermal and electrical engagement with the associated pellet 53 or 55. Each pair of pellets 53 and 55 is connected at the top by a hot-junction shoe 45. The end cap 63 of a pellet 55 of each pair is connected by a strap 73 to the end cap 61 of the pellet 53 of an adjacent cap. The pellet couples 53-55 are thus connected in series through their cold junctions by the straps 73.

The block 51 is sealed in a cylindrical casing composed of a shell 75 and bases 77 and 79 of Hastelloy-C alloy. The casing 75-77-79 is filled with argon or other inert gas which has a pressure of about one atmosphere when the apparatus is in use, to protect the pellets 53 and 55, and is sealed by electron-beam welding at the junctions of the shell 75 and the bases 77 and 79. An electrically insulating sheet 80 is interposed between the shoes 45 and the base 77.

The shell 75 is provided at the inner end (towards the Shield) with segments 82 consisting of alumina coated with gold. When the Module is mounted in the generator these segments 79 are in engagement with the adjacent parts of the generator. The gold bonds to these parts but the alumina may be separated from the gold permitting the Module to be removed.

On the outside of the shell 75 at the outer end (away from the Biological Shield) there is a power take-off assembly 81 including terminals 83 and 95 connected respectively to the cold junction of the first and last couple of the series aggregate of pellets 53 and 55. These terminals 83 and 85 are in a potting compound (Silicone) and are connected to wires in cables 87 and 88 from which the power is derived. The cables 87 and 88 are connected to output cables 89 through a disconnectible junction 91. The cables 91 are sealed pressure-tight through the Casing and are connected to a voltage-control box 100 including a conventional voltage regulator 102.3. The box 100 has an output converter 104 and cable 106 from which power may be derived.

Each Module 41 and 43 is connected in good heat-transfer relationship to the shield through a heat-transfer assembly including a generally elongated C-shaped plate 93 of Hastelloy-C alloy and the saddle 39. So that the Module 41 or 43 may be removed a sheet 95 of alumina coated on both faces with gold is interposed between the base 77 and the plate 93. The plate 93 consitutes one end plate of a sylphon assembly 101 by which each Module is resiliently suspended on a shock-absorbing assembly 103 resiliently suspended by another bellows assembly 104. The plate 93 is secured to the Biological Shield by key 105 of Kerrertium alloy which engage keyways in the Shield and saddle. The keys 105 are brazed to the plate 93.

Figure 3:
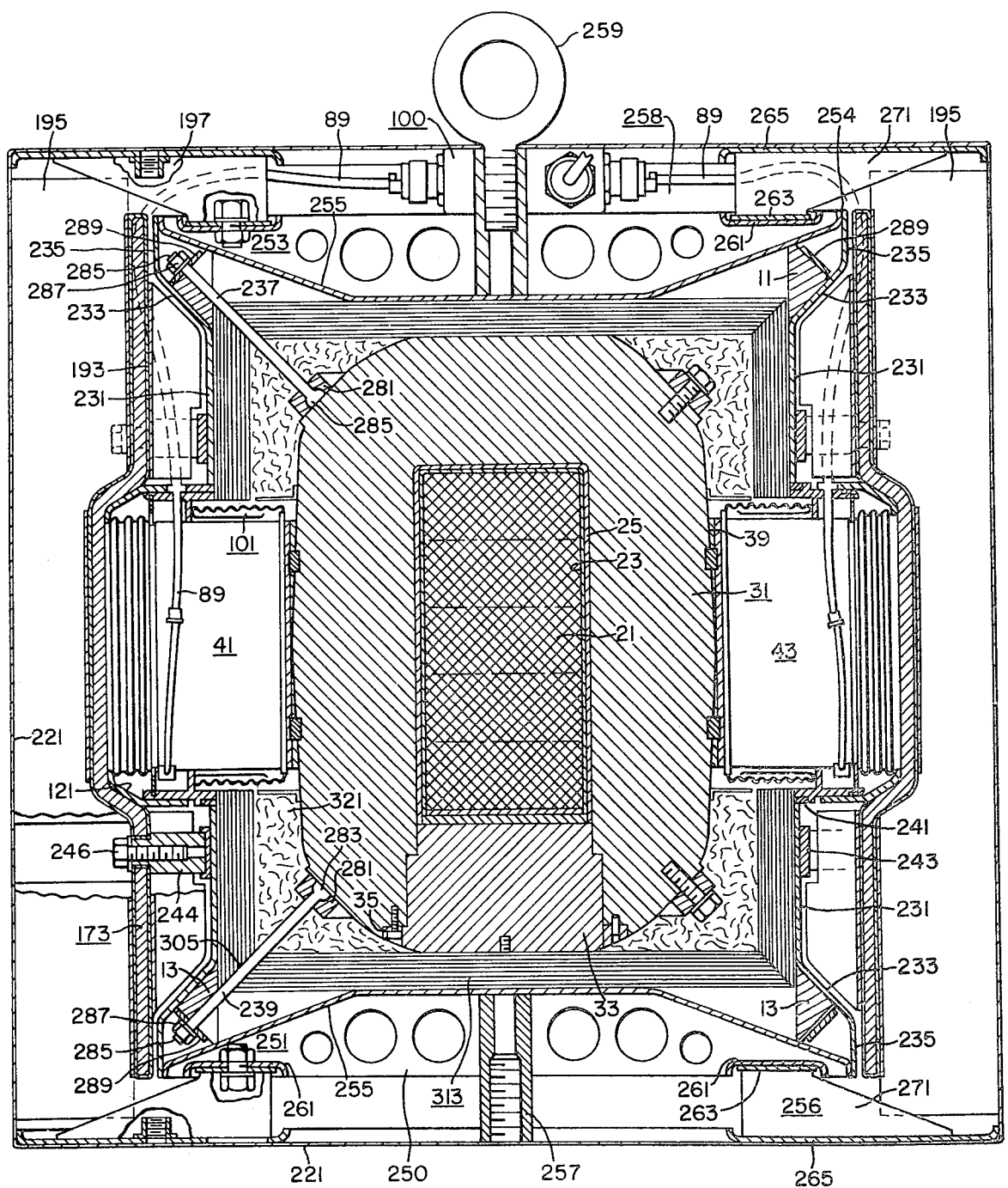
FIG. 3 is a view in section taken along line III—III of FIG. 2.
Figure 3A:
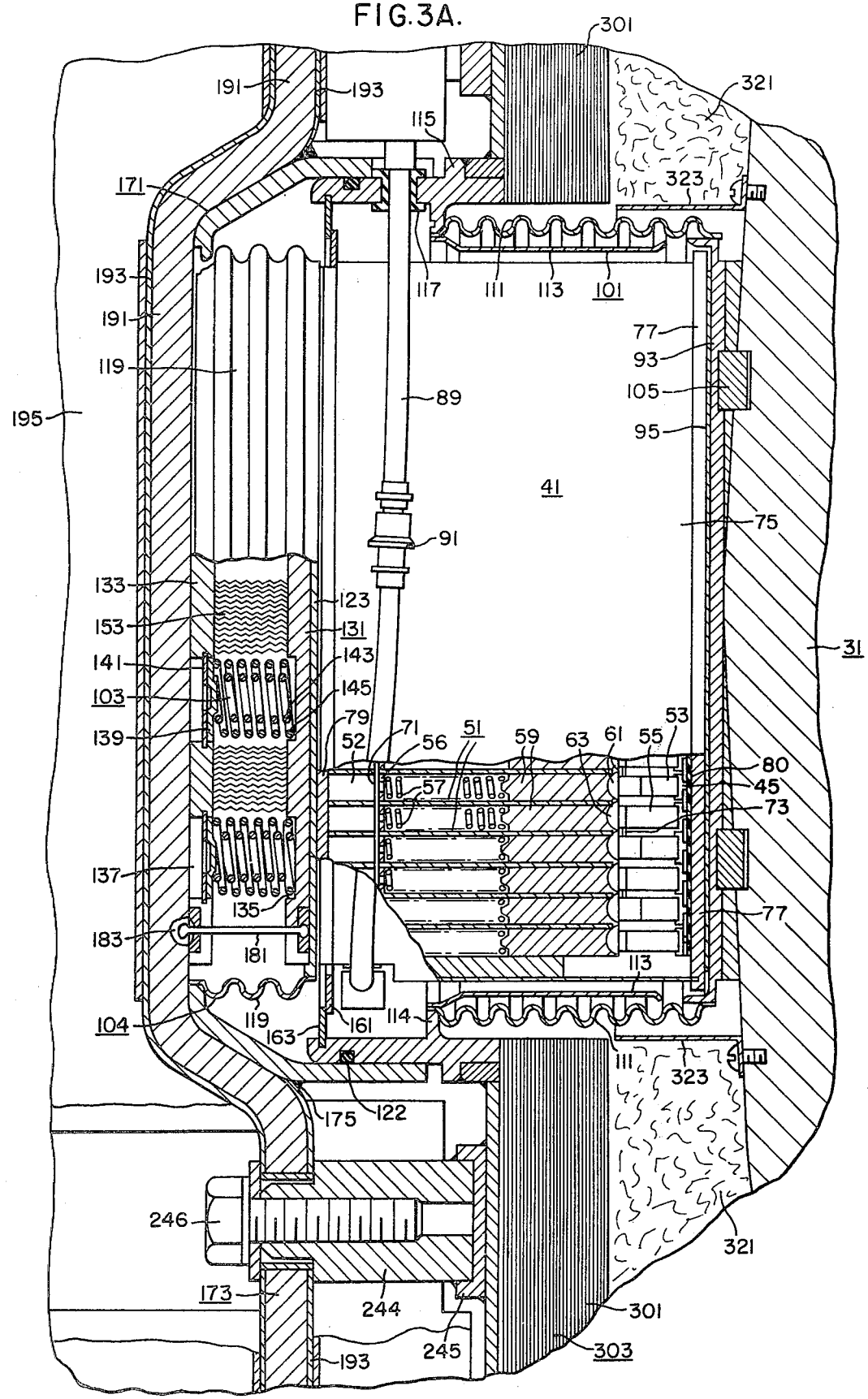
FIG. 3A is an enlarged fragmental view of FIG. 3.

The bellows assembly 101 includes a bellows 111 form the outer rim of which a guiding shell 113 extends. The assembly 101 also includes a supporting ring 115. The bellows 111 is welded, typically by electron-beam welding, to the plate 93 at the inner end and to a projection 114 from the ring 115 at the outer end. The ring 115 is provided with grommets 117 (FIG. 3, only one shown) through which the cables 89 pass. All the components of bellows assembly 101 are composed of Hastelloy-C alloy.

The bellows assembly 104 includes a bellows 119 and an outer ring 121 in the form of a bottomless cup. The bellows 119 is sealed between a plate 123 and the ring 121. The ring 115 is a tight slidable fit in the cup 121 and is welded to a skirt 241 of the Casing. An O-ring 122 is interposed between the ring 115 and the cup 121. All the parts of this assembly 104 are composed of Hastelloy-C alloy.

Figure 11:
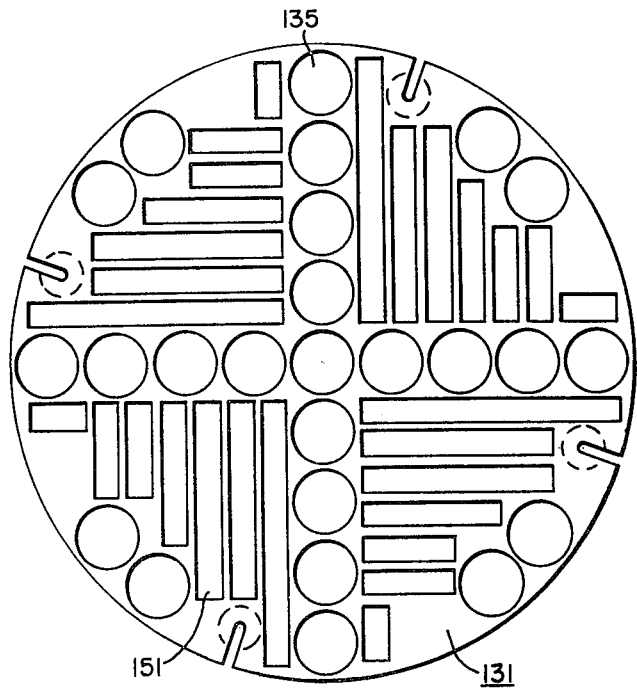
FIG. 11 is a plan view of a component of a shock absorber used in the practice of this invention.

The shock-absorber assembly 103 includes an inner pressure plate 131 (FIG. 11), which is in engagement with plate 123, that serves as a cover plate for the shock-absorber 103, and an outer pressure plate 133. The inner plate has a plurality of circular grooves 135 and the outer plate has a plurality of circular holes 137 (FIG. 3) coaxial with the grooves 135. In each hole 135 a locator washer 139 with a shoulder is held by a retaining ring 141. Inner and outer springs 143 and 145 rest against the shoulder of each washer 139. The springs 143 and 145 resiliently compress the inner plate 131 against the plate 123 which is resiliently movable by reason of the resilience of the bellows 119. The springs 143 and 145 thus act to compress the block 51 and the shoes 45 into firm heat transmitting engagement with the plates 77, 95, 93, the saddle 39 and the Biological Shield.

The inner and outer plates 133 and 135 include slots 151 (slots in inner plate not shown) extending from the periphery to the center in increasing length in all quadrants. The slots 151 in both plates are aligned. Masses 153 of crinkled copper sheet extend through the slots 151 in both plates 131 and 133 with their crinkled surfaces vertically between the inner and outer plates 131 and 133 and are welded on end to the remote edges of the plate. The plates 131, 133 are composed of copper; the springs 143 and 145 are composed of spring steel.

The Casing 75-77-79 and its content is suspended from the bellows 111 on retaining rings 161 and 163. Retaining ring 161 is a split ring which engages a shoulder 165 of the lower thickened portion 167 of the shell 75. The ring 163 is a resilient ring with a slot (not shown) in its periphery which is compressed into a groove in the ring or sleeve 115. The ring 163 supports ring 161 which in turn supports the shell 75 and its contents.

The bellows 119 is connected at one-end to the base of the ring 121 and at the other end to the plate or sheet 123 and permits the shock absorbing assembly 103 to support the Module resiliently through plate 123 and base 79. The springs 143 and 145 resiliently press the shoes 45 into good heat-receiving relationship with the heat-transfer assembly 77, 95, 93, 39. To improve heat flow there is a layer of gold between base 79 and plate 123.

Each thermoelectric Module is supported in a cup-shaped depression 171 of a transition member 173 of the Fin Assembly. The cup-shaped ring 121 is seated in this depression 171 engaging the sloping walls thereof. Near the region 175 where the depression 171 joins the remainder of the member 173 the ring 121 is welded pressure-tight to the member 173. The shock-absorbing assembly 103 is retained in the depression 171 by rods 181 which are secured along the rim of plate 131 and swaged through plate 133 into a hole 183 in the base of portion 171.

The Fin Assembly includes the transition member 173. This member 173 is composed of a copper core 191 for good heat conduction, encased in a cladding 193 of Hastelloy-C alloy for corrosion resistance and also for satisfactory welding to the ring 121, which is also composed of Hastelloy-C alloy, and for satisfactory brazing to the fins 195 and 197 which are also composed of Hastelloy-C alloy. The member 173 may be formed by brazing sheets of Hastelloy-C alloy on both bases of a copper plate and then forming the member 173. For brazing a shim of titanium is interposed between the copper and the alloy and the composite sheet-plate structure is heated to brazing temperature. Typically the core 191 has a thickness of about 0.350 inches and the cladding 193 thickness of aobut 0.020 inches. The cladding 193 is not present at the base of the cup 191 which is engaged by the base 133 of sylphon 103.

The ends of the member 173 are also encased in cladding of Hastelloy-C alloy. At the ends from which the Fin Assembly is mounted on the Casing, the cladding 201 is of generally C-section having a web substantially thicker than the other cladding 195.

The fins 195 and 197 are formed from a sheet of Hastelloy-C alloy which is corrugated into a structure of generally zig-zag section with flat ends 203. The fins 195 and 197 extend from both faces of the transition member 173 with the flat ends 203 abutting the member 173 brazed to it. Because the fins 195 and 197 are in both sides of the member 173 which receives the heat from the cold junction of the Module they effectively absorb this heat and the heat sink is highly effective.

Figure 5:
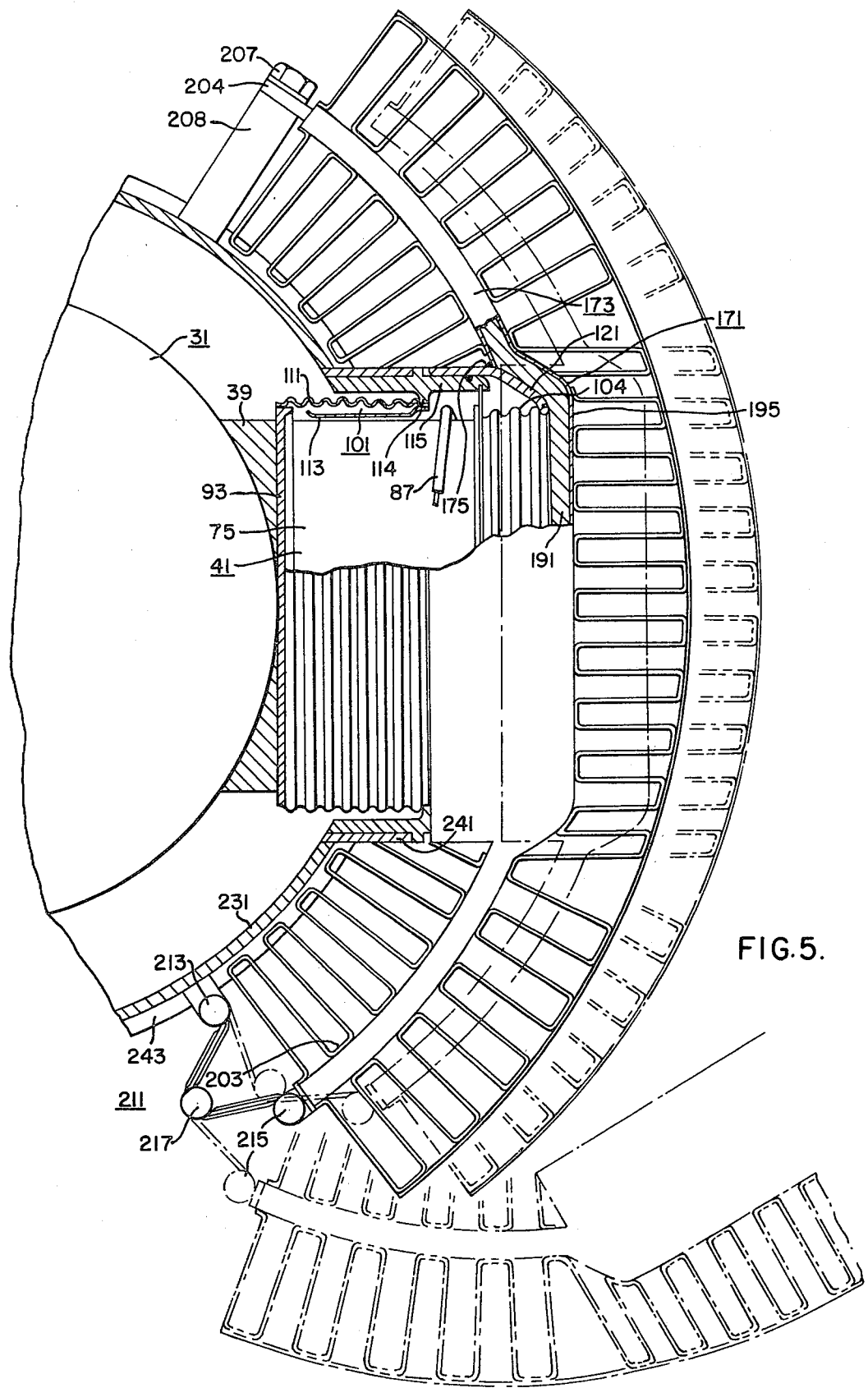
FIG. 5 is a plan view of a fin assembly for a module showing in broken lines the manner in which this assembly is moved to afford access to the module.

Each Fin Assembly and the ring 121 joined to it is removably secured to the Casing. At one end the Fin Assembly is bolted to studs 205 extending from the Casing. The bolts 207 pass through tabs 204 secured in the end cladding 201. At the opposite end each Fin Assembly is suspended from a hinge 211 (FIGS. 5, 6, 7, 8) including a fixed hinge pin 213 secured to the Casing and a plurality of movable hinge pins 215 and 217, one 215 pivotally connected to the end of the transition member 173 and the other 217 movably suspended between the pins 213 and 215. This hinge permits the removal of the Fin Assembly, which may weigh in excess of 100 pounds, from the Casing in two steps as shown in FIG. 5.

The Fin Assemblies are encased in a protective screen 221 which in in part supported from the fins 195 and in part from fins 223 spot welded to the Casing. The shell 221 is spot welded to the fins 195 and 223. The fins 223 serve to support the screen 221 and do not serve for heat removal purposes.

The Casing includes a cylindrical shell 231 of Hastelloy-C alloy having sloping shoulders 233 which flare into short end sections 235 of greater diameter than at the center. The rings 11 and 13 are welded internally to each of the sloping shoulders 235. The rings 11 and 13 are composed of high-strength, high-impact resistance alloy so that they are capable of withstanding the stress exerted by the rods 237 and 239 of the Spiders. Typically the rings 11 and 13 are composed of an alloy of titanium having 6% aluminum and 4% vandium. The shell 231 has openings into which the thermoelectric Modules 41 and 43 extend. Ring-shaped skirts 241 of Hastelloy-C alloy are welded into these openings. Bands 243 of Hastelloy-C alloy are welded to the outer suface of the shell 231 near the openings to support the Fin Assemblies. These bands 243 may be formed of coextensive semi-circular sections. Channel brackets 245 are welded to the bands 241 and the studs 244 for bolts 246 are welded to these brackets.

The Casing includes end-cap assemblies 251 and 253 of Hastelloy-C alloy which are welded at 254 pressure-tight to the runs of the sections 235 of the shell 231. Each assembly 251 and 253 includes a cup-shaped plate 255 to which fins 250 are spot welded. The fins 250 serve for mounting the support leg assembly 256 and 258 and not primarily for cooling. A lifting stud 257 is welded centrally to each of the plates 255, the fins 250 extending radially from this stud. The studs 257 are threaded internally so that an eye-bolt 259 may be inserted for lifting the Generator.

The leg assemblies 256 and 258 are supported from ring brackets 261 welded to the fins 250. Each assembly 256 and 258 is of generally truncated conical form including a ring 263 bolted to the brackets 261 and a ring-shaped support base 265, of greater outer and smaller inner diameter than the ring 263, which is turned up at its rims for stiffness. The rings 263 and 265 are held together by axial plates 271 welded to the rings. The rings 263 and 265 and the plates 271 are all composed of Hastelloy-C alloy and are all perforated to reduce weight.

Figure 4:
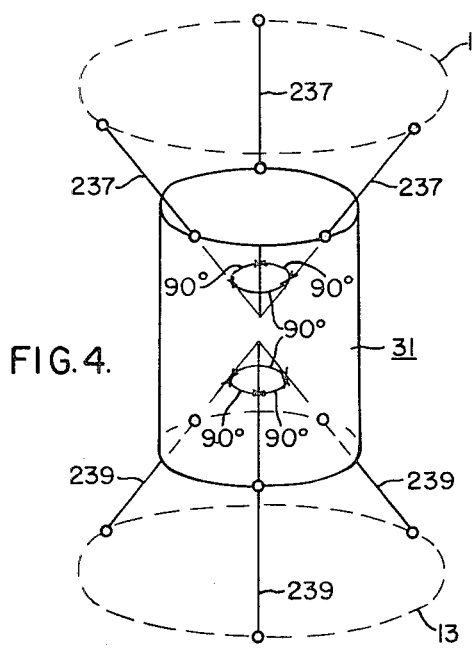
FIG. 4 is a diagrammatic view showing the spider suspension for the biological shield of the generator shown in FIG. 1.
Figure 6:
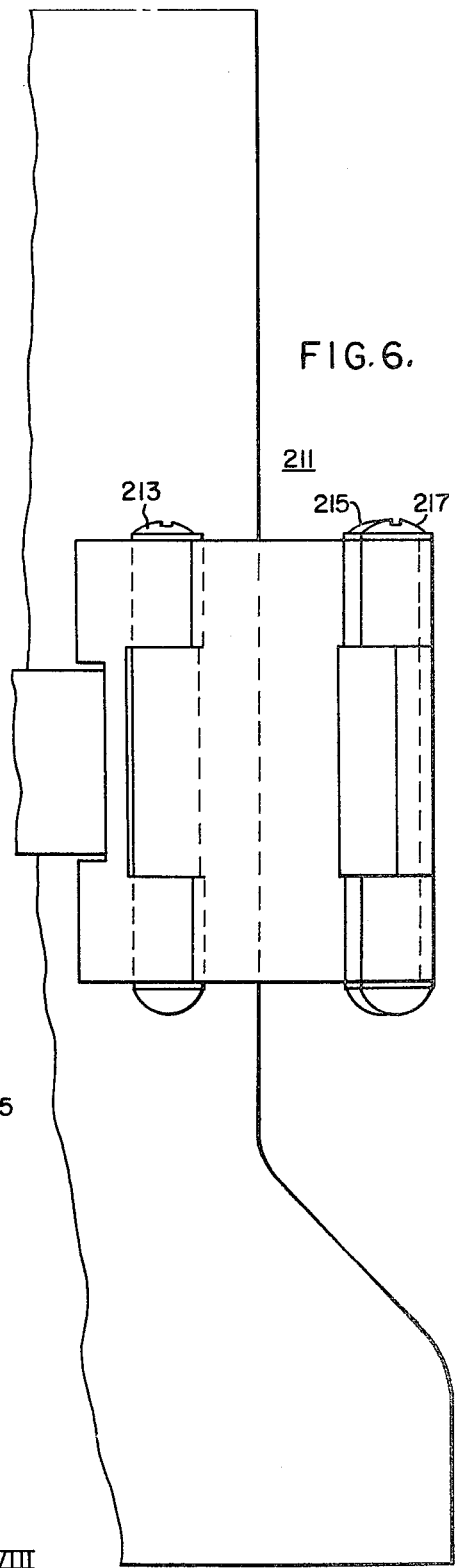
FIG. 6 is a plan view of the hinge of the fin assembly.
Figure 8:
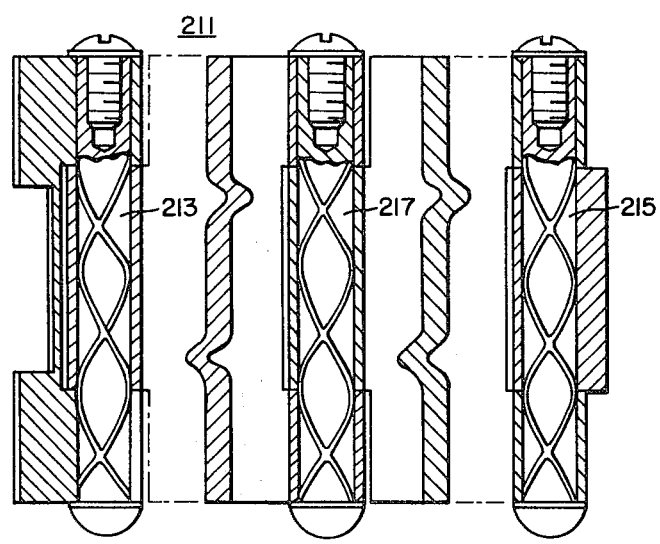
FIG. 8 is a view taken along line VIII—VIII of FIG. 7.
Figure 7:
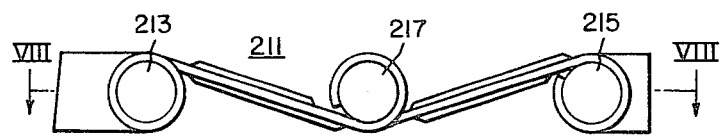
FIG. 7 is an end view of this hinge.

The Spiders suspend the Shield at each end from the Casing (FIG. 4). Each Spider includes a plurality of tension rods 237 and 239 respectively composed of a resilient high tension material such as a suitable IN-CONAL alloy of iron, nickel, and chromium. The rods 237 or 239 at each end extend from a ring 281 of the Ti-GAL-4V alloy, bolted to the Shield at each end, to the rings 11 and 13 respectively of the same alloy. The rods tension and 239 are such enlarged at one end 283. The enlarged ends engage and, are held in enlarged openings in the rings 281. Each rod 237 and 239 is threaded at the other end 285. The threaded end 285 of each rod 237 or 239 passes through an opening in a ring 11 or 13 and is tensioned by a nut 287. A ring 289 typically of 316 stainless steel is interposed between the nut 287 and a recession in the ring 11 or 13. The deflection of this ring 289 produced by screwing on the nut 287 to tnsion rod 237 or 239 serves to measure the tension in the rods. The deflection may be measured by a gauge interposed between the ring 11 or 13 and the ring 289. The rods 37 and 39 at each end respectively are so arranged that each pair of each set of rods defines a different plane, the planes being at right-angles to each other (see FIG. 4).

The Radiation Heat Shield includes a plurality of sheets or foil 310 of an alloy of 88% zirconium and 12% titanium wrapped in overlapping relationship to form a cylindrical wall 303 with tapered rims 305 at the bases. The overlapping is necessary to avoid building up foil at the joints. Because of the overlapping successive sheets 301 must have holes in different positions to accommodate the capsules 41 and 43. The Radiation Heat Shield also includes sheets 311 of the same alloy stacked to form truncated conical walls 313 meshing with the tapered ends 315 of the cylindrical wall 303 to form an enclosure. The sheets or foil 301 and 311 have cross grooves as shown in application Ser. No. 581,506 filed Sept. 23,1966 to David L. Purdy for Electrical Generator (FIGS. 7 and 8) so that they are in contact only at points to reduce thermal conduction.

The corners between the walls 303 and 313 and the Biological Shield are filled with gettering wool 321 of the Zr 88 Ti 12 alloy. The region bounded by the sylphon 11, the plates 93, the rings 115, and the Casing is sealed pressure tight and is vacuated. The foil 301 and 311 of the Heat Shield and the wool 321 serve as a getter to maintain the vacuum. The wool 321 is held by getter shields 323 of molybdeum.

In the use of the Generator the heat developed by the Capsule is transmitted through the Biological Shield to the hot-junctions of the Modules. The cold junctions are cooled by the Fin Assemblies and power is derived from the Modules.

While a preferred embodiment of this invention is disclosed herein, many modifications thereof are feasible. This invention then is not to be restricted except insofar as is necessitated by the spirt of the prior art.

What we claim is:

1. In a generator comprising a casing, a radioactive fuel capsule suspended within said casing, at least one thermoelectric module having both a cold junction and a hot junction, said hot junction absorbing heat from said capsule, the improvement comprising:
   a cup-shaped fin-transition member adapted normally to be in heat exchange relationship with matching surfaces of the cold junction of the thermoelectric module with which said fin-transition member is associated;
   a plurality of fins connected to opposite faces of said fin transition member;
   hinging means associating said fin-transition member with said casing whereby said fin-transition member can be swung away from said cold junction whenever access to its thermonuclear module is desired; and
   means adapted, except during such access to its thermonuclear module, to secure said hinged fin-transition member in said heat exchange relationship with said cold junction.

2. The generator of claim 1 wherein a shield surrounds said capsule, and resilient means urge the hot junction of the thermoelectric module into heat transfer relationship with sad shield and wherein a ceramic sheet which is a thermal conductor and an electrical insulator is interposed between said shield and said hot junction, said ceramic sheet having a coating adapted to prevent diffusion bonding of the thermoelectric module to the shield and to permit removal of a used thermoelectric module from the generator.

3. The module of claim 1 wherein the ceramic sheet is coated with an electricai conductor which does not diffusion-bond to the ceramic sheet under pressure and which can also be ruptured to permit separation of the hot junction from the shield.

4. The generator of claim 1 wherein the fin-transition member is composed of highly thermally conducting material having a protective skin of a corrosion-resistant material thereon.

5. The generator of claim 4 wherein the highly-thermally-conducting material is copper.

6. The thermoelectric generator of claim 1 wherein the fin-transition member is bowed into cup shape between its ends and the module extends into the bowed portion of said member with the cold junction in heat-interchange relationship with the seat of the bowed portion and fins extending from the member on each side of the module.

7. The thermoelectric generator of claim 1 wherein the fin-transition member is bowed into cup shape between its ends and the module extends into the bowed portion of said member with the cold junction in heat-interchange relationship with the seat of the bowed portion and fins extend along the whole length of the member from the side of the member away from the module and only from the portions of the member on both sides of the bowed portion from the side of the member towards the module.

* * * * *

UNITED STATES PATENT OFFICE
CERTIFICATE OF CORRECTION

PATENT NO. : 3,989,546
DATED : November 2, 1976
INVENTOR(S) : David L. Purdy, et al It is certified that error appears in the above-identified patent and that said Letters Patent are hereby corrected as shown below:

Column 8, line 53 - In Claim 2, the word "sad" should be deleted and the word "said" substituted in its place.

Signed and Sealed this

Fourth Day of January 1977

[SEAL]

Attest:

RUTH C. MASON
Attesting Officer

C. MARSHALL DANN
Commissioner of Patents and Trademarks